TUNNEL DIODE TUNED AMPLIFIER STABILIZED AGAINST OSCILLATIONS

Filed Oct. 18, 1961

INVENTORS
CLEMENT A. SKALSKI
STEPHEN T. MASIE
BY
Henry L. Shenier
ATTORNEY

United States Patent Office 3,235,814
Patented Feb. 15, 1966

3,235,814
TUNNEL DIODE TUNED AMPLIFIER STABILIZED AGAINST OSCILLATIONS

Clement A. Skalski, Norwalk, Conn., and Stephen T. Masie, Port Chester, N.Y., assignors to United Aircraft Corporation, East Hartford, Conn., a corporation of Delaware Filed Oct. 18, 1961, Ser. No. 145,820
9 Claims. (Cl. 330—61)

Our invention relates to tunnel diode tuned amplifiers and more particularly to circuits for stabilizing regenerative band-pass amplifiers.

Tunnel diodes provide negative resistance over an extremely wide band of frequencies. Where only a narrow frequency band is desired to be amplified, the wide-band negative resistance characteristic of tunnel diodes is undesirable, since oscillation can develop at a frequency outside the pass band. We have invented a regenerative tuned amplifier incorporating a tunnel diode in which negative resistance appears only within a narrow frequency band.

One object of our invention is to provide a stable tunnel diode tuned amplifier.

Another object of our invention is to provide a tunnel diode tuned amplifier incorporating a stabilizer circuit to prevent oscillation.

A further object of our invention is to provide a tunnel diode tuned amplifier in which a stabilizer circuit shunting the tunnel diode limits the frequency band over which negative resistance appears.

Other and further objects of our invention will appear from the following description.

In general, our invention contemplates the provision of a regenerative band-pass amplifier in which negative resistance is provided by a tunnel diode. In order to restrict the frequency band over which the negative resistance appears, we shunt the diode with a stabilizer circuit. The characteristics of this circuit are such that within the pass band the circuit presents a low conductance shunting the diode, whereas outside the pass band the circuit shunts the diode with a positive conductance somewhat greater than the negative conductance of the diode so that the effective parallel conductance is positive.

In the accompanying drawings which form part of the instant specification and which are to be read in conjunction therewith and in which like reference numerals are used to indicate like parts in the various views.

Figures 1, 2, 3, 4, 5:
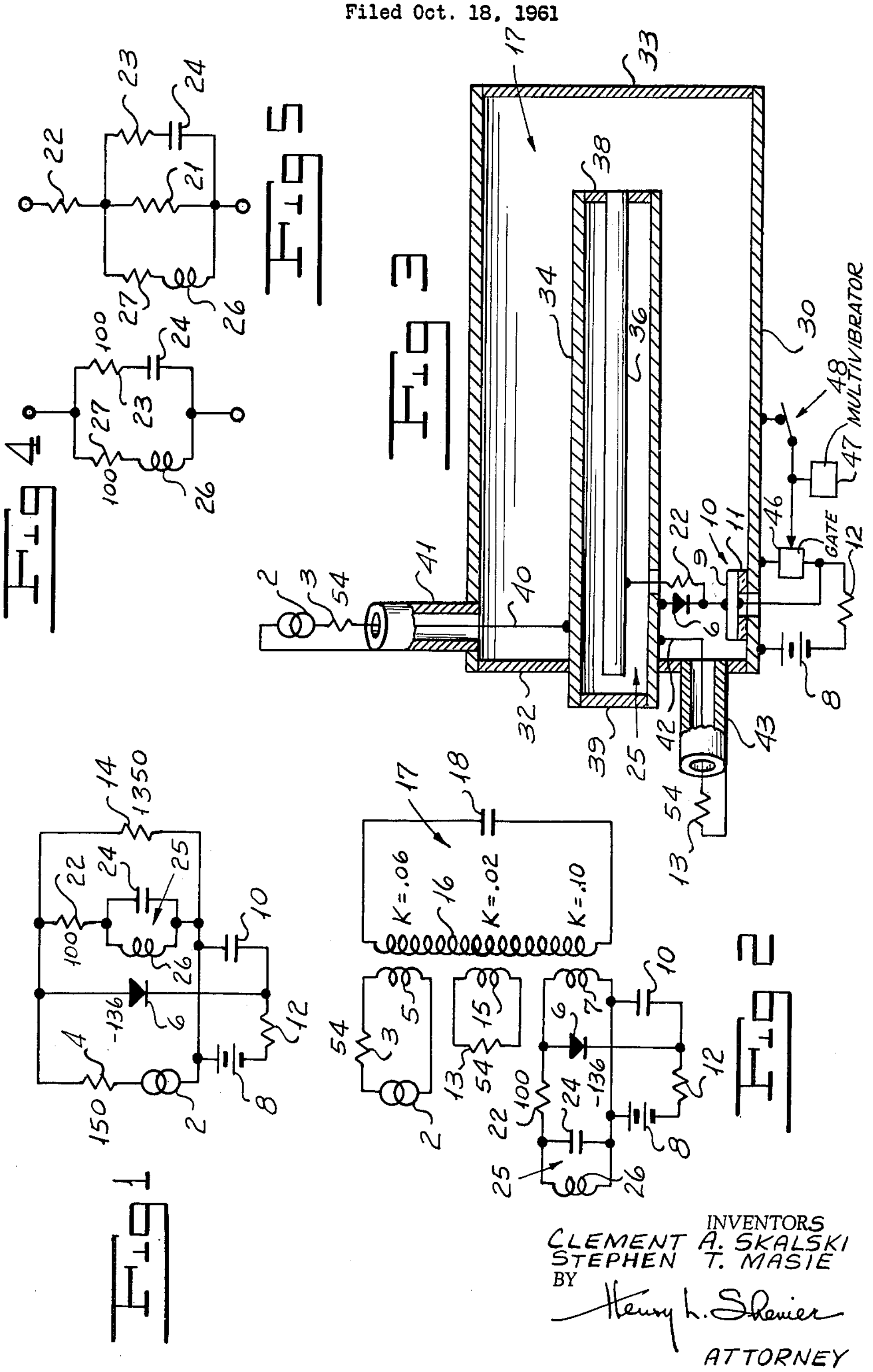
FIGURE 1 is a schematic view of a direct-coupled amplifier incorporating a first embodiment of our stabilizer circuit.
FIGURE 2 is a schematic view of a transformer-coupled amplifier incorporating the first embodiment of our stabilizer circuit.
FIGURE 3 is a sectional view of coaxial cavity amplifier incorporating the first embodiment of our stabilizer circuit.
FIGURE 4 is a schematic view showing a second embodiment of our stabilizer circuit.
FIGURE 5 is a schematic view showing a generalized embodiment of our stabilizer circuit.

Referring now more particularly to FIGURE 1 in the drawings, the amplifier includes a source of input voltage 2 having an internal or input resistance 4 which may be 150 ohms. The amplifier is shunt connected. The output resistance 14 should be relatively high compared with the input resistor 4. The ratio of output resistance to input resistance may conveniently by nine. Thus the output resistor 14 may have a value of 1350 ohms. A tunnel diode 6 may provide a negative resistance of 136 ohms within the pass band. Diode 6 is biased by a battery 8 through a bias resistor 12. A capacitor 10 shunts battery 8 and bias resistor 12 so that for all except low frequencies the effective impedance of the biasing circuit is substantially zero. Thus, within the pass band tunnel diode 6 is effectively shunt-connected by virtue of the negligible impedance of capacitor 10. It will be noted that the parallel combination of input resistor 4 and output resistor 14 yields an effective resistance of 135 ohms, which is slightly less than the negative resistance presented by diode 6 in the pass band. It is necessary for stability that the resistance shunting the tunnel diode be less than the negative resistance of the diode. The closer the total shunt conductance approaches the negative conductance of the diode, the higher the gain of the amplifier because of approach to a condition of instability. The amplifier as thus far described is apparently stable not only within the pass band but for all frequencies. However, it is to be noted that the negative resistance presented by the tunnel diode is frequency-dependent. At frequencies considerably less than the pass band the negative resistance presented by the tunnel diode will decrease to less than 135 ohms, throwing the circuit into oscillation. We provide a stabilizer which shunts the tunnel diode 6. The stabilizer includes a circuit indicated generally by the reference numeral 25 comprising a parallel-connected inductor 26 and capacitor 24. The pass band of the amplifier is defined by the parallel resonant frequency of the tank circuit 25. The stabilizer further includes a resistor 22 in series with tank circuit 25. Resistor 25 may conveniently have a value of 100 ohms.

In operation of the circuit of FIGURE 1, diode 6 is loaded within the pass band only by input resistor 4 and output resistor 14. The effective parallel combination of these resistances is slightly less than the negative resistance presented by the tunnel diode within the pass band. The amplifier is thus stable with a high gain. Parallel resonant tank circuit 25, which is tuned to the center frequency of the pass band, presents an extremely high impedance in series with stabilizer resistor 22, effectively preventing any loading of the amplifier by the stabilizing resistor 22. Outside the pass band tank circuit 24 presents a low impedance in series with the stabilizer resistor 22, causing diode 6 to be shunted by resistor 22. It will be noted that the resistance of stabilizer resistor 22 is less than the negative resistance of diode 6. Accordingly, the combination of tunnel diode and stabilizer present a negative resistance within a frequency band which includes the pass band. Outside of this negative resistance frequency band, the combination of tunnel diode and stabilizer presents a positive resistance. Within the pass band of the amplifier itself the stabilizer presents substantially no shunt conductance.

In a regenerative amplifier there is no isolation between input and output unless a circulator is used. Accordingly, noise in the load resistor is amplified. To reduce the noise figure in parallel-connected regenerative amplifiers, it is necessary that the load conductance be small compared with the input conductance. Thus, we have shown the output resistance to be considerably larger than the input resistance to improve the noise figure.

Referring now to FIGURE 2 we provide a tuned circuit indicated generally by the reference numeral 17, which comprises an inductor 16 and a capacitor 18. The input source 2 is connected through a resistor 3 having a value of 54 ohms to a winding 5. An output resistor 13 having a value of 54 ohms is connected to a winding 15. The tunnel diode 6 is coupled to winding 7 by a biasing circuit including battery 8, resistor 12, and bypass capacitor 10. Diode 6 is shunted by the stabilizer circuit including parallel connected inductor 26 and capacitor 24 which are in series with stabilizer resistor 22 again having a vaule of 100 ohms. Windings 5, 15 and 7 are coupled to winding 16 by the coefficients of coupling .06, .02, and .10, respectively. Circuits 17 and 25 are each tuned to the center frequency of the pass band. The impedances coupled to circuit 17 within the pass band vary as the reciprocal of the squares of the various coefficients of coupling. With the resistance values and coefficients of coupling shown in FIGURE 2 the gain and band width of the amplifier of FIGURE 2 will be the same as that of the amplifier in FIGURE 1. It will be noted that the input coupling is three times the output coupling and that the negative resistance coupling is five times the output coupling. The input loading will thus be nine times the output loading even though equal values of input and output resistors are employed. In FIGURE 2 the impedance transformations are preserved only within a frequency band which includes the pass band. For frequencies considerably outside the pass band diode 6 is not appreciably loaded by the input and output circuits. Accordingly, the presence of a stabilizer is more important than in FIGURE 1. Outside the pass band the stabilizing effect of input resistor 3 and output resistor 13 is entirely lost for transformer coupling. It will be noted that in the direct-coupled amplifier of FIGURE 1, input resistor 4 and output resistor 14 provide some stabilizing effect at all frequencies. In FIGURE 1 stabilizing resistor 22 may have a large resistance value which is greater than the negative resistance of diode 6, but in FIGURE 2 stabilizing resistor 22 must have a resistance value which is at least slightly less than the negative resistance of didoe 6. FIGURE 2 is not only a useful circuit in itself but is also a lumped-constant equivalent circuit of the coaxial cavity amplifier shown in FIGURE 3.

Referring now to FIGURE 3, a quarter wave length coaxial cavity is indicated generally by the reference numeral 17 and is defined by an outer conductor 30 and an inner conductor 34. Conductors 30 and 34 are short circuited by an end plate 32. Inner conductor 34 may be slightly less than a quarter wave length because of the fringing capacitance between the open circuited end of inner conductor 34 and a second end plate 38. Cavity 17 is resonant at the center frequency of the pass band. A source of input voltage 2 is connected through an input resistor 3 having a value of 54 ohms to a coaxial line 41 having a characteristic impedance of 54 ohms. Line 41 enters cavity 17 through the outer conductor 30 adjacent the short circuiting plate 32. Line 41 is magnetically coupled to the cavity 17 by a coupling loop 40. An output coaxial line 43 having a characteristic impedance of 54 ohms is terminated by a load resistor 13 having resistance value of 54 ohms. Line 43 extends through the short circuiting plate 32. Line 43 is magnetically coupled to cavity 17 by a coupling loop 42. The area enclosed by coupling loop 40, end plate 32, and inner and outer conductors 34 and 30 should be approximately three times the area enclosed by coupling loop 42, end plate 32, and inner conductor 34. With a ratio of three-to-one for the area of coupling loop 40 to the area of coupling loop 42, the corresponding ratio of the coefficients of coupling of input and output will likewise be three-to-one. This yields an impedance transformation ratio of nine-to-one. The positive terminal of bias battery 8 is connected to the outer conductor 30. The negative terminal of battery 8 is connected through a bias resistor 12 to a thin disc 9 which forms one plate of a bypass capacitor indicated generally by the reference numeral 10. Disc 9 is separated from conductor 30 by a thin dielectric wafer 11. Because of the negligible impedance of capacitor 10 within the pass band, diode 6 is effectively connected to outer conductor 30 at signal frequencies. Tunnel diode 6 is shunt-connected between the inner conductor 34 and disc 9 adjacent the short circuiting end plate 32. The area enclosed by shunt-connected diode 6, end plate 32, and inner and outer conductors 34 and 30 should be approximately five times the area enclosed by coupling loop 42. The ratio of coefficients of coupling will thus be the same as specified in FIGURE 2. Diode 6 is shunted by the stabilizer circuit including resistor 22 in series with a coaxial cavity, indicated generally by the reference numeral 25, which is anti-resonant at the center frequency of the pass band. Cavity 25 is quarter wave resonant in the pass band. Cavity 25 is defined by the internal surface of inner conductor 34 and an interior conductor 36. Conductors 34 and 36 are short-circuited by an end wall 38. The length of conductor 36 may be slightly less than a quarter wave length due to the fringing capacitance between the open circuited end of interior conductor 36 and a second end wall 39. Resistor 22 is tap-connected to conductor 36 at a point removed from the open circuited end to provide a reduced impedance level of cavity 25. The purpose of this will be pointed out hereinafter.

The operation of the coaxial line amplifier of FIGURE 3 is analogous to the operation of FIGURE 2 not only within the pass band but for all frequencies up to approximately three times the operating frequency. Because of the nature of coaxial lines, an additional resonance will occur at three times the center frequency of the pass band where each of cavities 17 and 25 exhibit three-quarters wave length resonance. At such frequency, oscillation would develop unless appreciable shunt conductance were coupled to cavity 17 by loops 40 and 42 or unless diode 6 had exceeded its resistive cutoff frequency. As we have previously pointed out, the shunt negative resistance presented by tunnel diode 6 is frequency dependent. At very low frequencies its shunt negative resistance may be 130 ohms. Within the pass band its negative resistance should be 136 ohms. If the negative conductance of diode 6 drops to zero at a frequency less than three times the center frequency of the pass band, then no oscillations will develop in the higher order modes of cavities 17 and 25 even if negligible conductance be coupled to the cavity by loops 40 and 42.

We have found that the shunt conductance G of the stabilizer circuit such as shown in FIGURES 1, 2 and 3 may be implicitly determined from the following equation:

$$GR=\frac{Q^2(x^2-1)^2}{Q^2(x^2-1)^2+x^2}$$

where $$x=\frac{w}{w_o}$$

where $$w_o=\frac{1}{\sqrt{LC}}$$

where R is the resistance value of resistor 22, where L is the inductance value of inductor 26, where C is the capacitance value of capacitor 24, where $$Q=\frac{R}{w_oL}=Rw_oC=\frac{R}{\sqrt{L/C}}$$

where $w$ is radian frequency, and where $w_o$ is the center radian frequency of the pass band. It will be noted that the conductance selectivity of the stabilizer circuit is determined by its Q value, which is represented by the ratio of R to the characteristic resistance of the anti-resonant tank circuit 25. In FIGURES 2 and 3, since the value of R must be less than the negative resistance of the tunnel diode, the Q values are basically determined by the characteristic resistance of the parallel resonant circuit 25. The effect of regeneration is to increase the gain while reducing the band width. The band width of the amplifier is basically determined by the Q value of the stabilizer for a given amount of regeneration. This is especially evident in FIGURE 1, since only the stabilizer tuned circuit is involved. The band width of the regenerative amplifier will, of course, be considerably less than the apparent band width of the stabilizer circuit. In FIGURES 2 and 3, it is essential that the band width of the stabilizer circuit be less than the band width of the tuned circuit 17 when loaded by the input and output resistances. In order to insure stability, the Q of the stabilizer circuit should be at least equal to or preferably greater than the Q of the tuned circuit 17 when loaded by input and output resistances. Because of regeneration, however, the effective Q of the amplifier will be many times that of the stabilizer. By causing the Q of the stabilizer to be greater than the Q of the resonant circuit loaded by input and output resistances, we insure that the rate of increase of stabilizer conductance is greater than the rate of decrease of loading conductance outside the pass band. The characteristic resistance of parallel resonant tank circuit or cavity 25 should be relatively low, requiring small inductance values and large capacitance values, or a low cavity impedance level, to achieve a relatively high stabilizer Q. Furthermore, the Q of the tuned circuit 17 when loaded by input and output resistance should be relatively low.

Referring now to FIGURE 4, we have shown another embodiment of stabilizer circuit in which equal stabilizing resistances 27 and 23 are inserted in series with inductor 26 and capacitor 24 respectively. The stabilizer of FIGURE 4 does not present zero conductance at the center frequency of the pass band and in this respect is inferior to the stabilizer circuit of FIGURES 1, 2, and 3, because it impairs the noise figure. We have found that the shunt conductance G of the stabilizer of FIGURE 4 may be implicitly determined from the following equation:

$$GR=\frac{Q^2(x^4+1)+2Q^4x^2}{Q^2(x^4+1)+(Q^4+1)x^2}$$

where R is the value of either of the equal resistors 23 and 27. The stabilizer of FIGURE 4 must operate with fractional values of Q, since the conductance is a constant value with no dip in the pass band if Q is unity. The stabilizer is not very satisfactory for the amplifiers shown in FIGURES 2 and 3 because of its excessively low Q values. However, this stabilizer is entirely adequate to tune the extremely wide-band direct-coupled amplifier of FIGURE 1.

Referring now to FIGURE 5 we have shown a generalized stabilizer circuit. As previously indicated, the stabilizer of FIGURES 1, 2, and 3 is ideal. Thus, in FIGURE 5, it is desirable that resistors 27 and 23 have small values and that the resistor 21 which shunts the tank circuit have a large value. If resistors 23 and 27 approach a zero value and resistor 21 approaches an infinite value, the stabilizer of FIGURE 5 reduces to that shown in FIGURES 1, 2, and 3.

Thus far we have considered only regenerative amplifiers where the negative resistance provided by diode 6 is slightly greater than the shunt resistance of the input and output resistors; that is, where the sum of the loading conductances is slightly greater than the negative conductance of the tunnel diode. However, super-regenerative amplifiers are also contemplated where the negative conductance of the diode is slightly increased and its negative resistance is slightly reduced so that oscillations build up.

Referring again to FIGURE 3 the junction of resistor 12 and capacitor disk 9 is connected through a gate 46 to the outer conductor 30. Gate 46 is actuated by the output of a free-running quench multivibrator 47. We provide a switch 48 which, in the closed position shown, connects the output of multivibrator 47 to the outer conductor 30. In the closed position of switch 48, the output of multivibrator 47 is rendered ineffective to control gate 46; and the amplifier is merely regenerative. With switch 48 in the closed position shown, a small current flows through gate 46 causing the negative resistance of diode 6 to be −136 ohms as previously described. With switch 48 open, the square-wave output of the free-running quench multivibrator 47 periodically drives gate 46 hard "on" and alternately hard "off." When gate 46 is driven hard off, no gate current flows; and diode 6 is biased slightly further into the negative conductance region to provide a negative resistance of −134 ohms. Thus when multivibrator 47 drives gate 46 hard off, the negative conductance of diode 6 is greater than the loading conductances of the input and output coupling loops in the pass band. The circuit now being super-regenerative, oscillation builds up at the desired resonant frequency of cavity 17. When multivibrator 47 drives gate 46 hard on, the bias across diode 6 is reduced to substantially zero, whereupon it assumes a positive conductance. Cavity 17 is now loaded not only by the positive conductance of the input and output coupling loops but also by the unbiased tunnel diode. The oscillations which previously built up now decay. After the oscillations have been thus quenched, multivibrator 47 again turns gate 46 hard off. The circuit is again rendered super-regenerative by the biasing of diode 6 heavily into the negative conductance region; and oscillations again build up. It will be seen that the super-regenerative operation with switch 48 open is conventional.

However, even for super-regenerative operation with switch 48 open, the stabilizer circuit comprising resistor 22 and cavity 25 prevents the development of any parasitic oscillations and insures that oscillation can build up only at the resonant frequency of cavity 17.

It will be seen that we have accomplished the objects of our invention. We have provided a tunnel diode regenerative tuned amplifier which is stable. Oscillation is prevented by our stabilizer circuit which shunts the diode. The stabilizer circuit provides a low shunt conductance in the pass band and a high shunt conductance outside the pass band. Our stabilizer circuit thus limits the frequency band over which negative resistance is presented.

Having thus described our invention, what we claim is:

1. A band-pass amplifier including in combination a negative resistance device, an input conductance, an output conductance, a stabilizer comprising a resistor connected in series with a substantially lossless circuit which is anti-resonant at the center frequency of the pass band, means coupling the input conductance in shunt with the device, means coupling the output conductance in shunt with the device, and means connecting the stabilizer in shunt with the device.

2. A band-pass amplifier as in claim 1 in which the input coupling means has a certain coefficient of coupling, in which the output coupling means has a predetermined coefficient of coupling, and in which the product of the input conductance and the square of its coefficient of coupling is much greater than the product of the output conductance and the square of its coefficient of coupling.

3. A band-pass amplifier as in claim 1 in which the means coupling the input and output conductances in shunt with the device include a circuit tuned to the center frequency of the pass band.

4. A band-pass amplifier as in claim 1 in which the circuit comprises a parallel resonant inductor and capacitor.

5. A band-pass amplifier as in claim 1 in which the circuit comprises a cavity resonator.

6. A band-pass amplifier as in claim 1 in which the device comprises a tunnel diode.

7. A band-pass amplifier as in claim 1 in which the circuit comprises a substantially one-quarter wave-length transmission line, one end of which is short-circuited.

8. A superregenerative band-pass amplifier including in combination
  a tunnel diode,
  a stabilizer circuit providing a conductance which is a minimum at the center frequency of the pass band,
  means shunting the diode with the circuit,
  an input conductance and an output conductance,
  means coupling the input and output conductances in shunt with the diode, and
  means for periodically biasing the diode into a negative conductance condition,
  the sum of the minimum stabilizer circuit conductance and the input and output conductances coupled in the pass band being less than the negative conductance of the biased diode.

9. A superregenerative band-pass amplifier as in claim 8 in which the periodic biasing means includes
  a bias circuit comprising a source in series with a resistance,
  a gate shunting the bias circuit, and
  means including a multivibrator for alternately enabling and disabling the gate.

References Cited by the Examiner

UNITED STATES PATENTS

| | | | |
|---|---|---|---|
| 3,061,786 | 10/1962 | Theriault | 307—88.5 |
| 3,112,454 | 11/1963 | Steinhoff | 330—34 XR |
| 3,116,459 | 12/1963 | Tiemann | 330—24 |
| 3,127,567 | 3/1964 | Chang | 330—34 |
| 3,127,574 | 3/1964 | Sommers | 330—34 XR |

OTHER REFERENCES

Theriault, "Method of Achieving Proper Loading on Tunnel Diodes," RCA Technical Notes, No. 382, June 1960.

Chang, K.K.N., "Low-Noise Tunnel-Diode Amplifier," Proceedings of the IRE, pages 1268–1269, July 1959.

Electronics Engineering: "The Tunnel Diode," April 1960, page 245.

Hines, M. E., et al., "High Frequency Negative-Resistance Circuit Principles for Esaki-Diode Applications," in Digest of Technical Papers, 1960, Intnl. Solid-State Circuits Conference, pp. 12–13.

ROY LAKE, *Primary Examiner.*

JOHN KOMINSKI, *Examiner.*